United States Patent
Kim

(10) Patent No.: US 8,963,261 B2
(45) Date of Patent: Feb. 24, 2015

(54) CAPACITIVE TRANSDUCER AND METHODS OF MANUFACTURING AND OPERATING THE SAME

(75) Inventor: Che-heung Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 135 days.

(21) Appl. No.: 13/591,845

(22) Filed: Aug. 22, 2012

(65) Prior Publication Data

US 2013/0049528 A1  Feb. 28, 2013

(30) Foreign Application Priority Data

Aug. 22, 2011  (KR) .................. 10-2011-0083582

(51) Int. Cl.
*H01L 21/02* (2006.01)
*B81B 3/00* (2006.01)

(52) U.S. Cl.
CPC ......... *B81B 3/0021* (2013.01); *B81B 2201/038* (2013.01); *B81B 2203/0127* (2013.01); *B81B 2203/053* (2013.01)
USPC .................... 257/414; 257/419; 257/E29.239

(58) Field of Classification Search
CPC ......... H01L 27/12; H01L 27/20; H01L 27/22; H01L 41/1136; H01L 41/094; H01L 43/12
USPC .................... 257/414–419, E29.324
See application file for complete search history.

(56) References Cited

U.S. PATENT DOCUMENTS

| | | | |
|---|---|---|---|
| 6,140,144 A * | 10/2000 | Najafi et al. | 438/53 |
| 6,472,243 B2 * | 10/2002 | Gogoi et al. | 438/50 |
| 6,905,970 B2 | 6/2005 | Shing et al. | |
| 7,112,860 B2 * | 9/2006 | Saxler | 257/416 |
| 7,944,008 B2 * | 5/2011 | Parks et al. | 257/419 |
| 8,101,458 B2 * | 1/2012 | Kumar et al. | 438/106 |
| 8,101,469 B2 * | 1/2012 | Kumar et al. | 438/123 |
| 8,129,802 B2 * | 3/2012 | Fukuda et al. | 257/415 |
| 8,173,513 B2 * | 5/2012 | Villa et al. | 438/422 |
| 8,298,837 B2 * | 10/2012 | Wang et al. | 438/5 |
| 8,575,710 B2 * | 11/2013 | Villa et al. | 257/415 |
| 2004/0065931 A1 | 4/2004 | Benzel et al. | |
| 2009/0320167 A1 | 12/2009 | Kobayashi et al. | |

FOREIGN PATENT DOCUMENTS

| | | |
|---|---|---|
| JP | 11-017195 A | 1/1999 |
| JP | 2002-005763 A | 1/2002 |
| KR | 10-0456611 B1 | 11/2004 |

* cited by examiner

*Primary Examiner* — Michael Lebenetritt
(74) *Attorney, Agent, or Firm* — Sughrue Mion, PLLC

(57) ABSTRACT

Provided are a capacitive transducer, and methods of manufacturing and operating the same. The capacitive transducer includes: a monolithic substrate comprising a first doping region, a second doping region that is opposite in conductivity to the first doping region, and a vibrating portion; and an empty space that is disposed between the first doping region and the vibrating portion. The vibrating portion includes a plurality of through-holes, and a material film for sealing the plurality of through-holes is disposed on the vibrating portion.

15 Claims, 16 Drawing Sheets

CAPACITIVE TRANSDUCER AND METHODS OF MANUFACTURING AND OPERATING THE SAME

CROSS-REFERENCE TO RELATED APPLICATION

This application claims priority from Korean Patent Application No. 10-2011-0083582, filed Aug. 22, 2011 in the Korean Intellectual Property Office, the disclosure of which is incorporated herein in its entirety by reference.

BACKGROUND

1. Field

The present disclosure relates to energy converters, and more particularly, to capacitive transducers and methods of manufacturing and operating the same.

2. Description of the Related Art

A micro-transducer which is used to convert energy includes a substrate and a diaphragm. The diaphragm vibrates at a predetermined magnitude and a predetermined frequency of a voltage applied to the diaphragm.

The diaphragm is formed by being attached to a silicon substrate. Alternatively, the diaphragm may be formed by forming a part of the diaphragm on a silicon substrate, forming another part of the diaphragm on another substrate, and bonding the silicon substrate to the other substrate.

However, the transducer formed by using such a related art method has an interface between the substrate and the diaphragm due to bonding or deposition. Accordingly, the structural stability of the transducer may be reduced when the transducer is repeatedly used.

Also, in order to electrically insulate electrodes to which a voltage is applied in order to operate the transducer, an insulating layer is formed between the electrodes. The insulating layer may be charged, thereby reducing the reliability of the transducer.

Furthermore, when the related art method is used, stress may be caused by the bonding or the deposition.

SUMMARY

One or more embodiments provide capacitive transducers.

One or more embodiments also provide methods of manufacturing and operating the capacitive transducers.

Additional aspects will be set forth in part in the description which follows and, in part, will be apparent from the description, or may be learned by practice of exemplary embodiments.

According to an aspect of an embodiment, there is provided a transducer including: a first doping region; a second doping region that is opposite in conductivity to the first doping region and includes a first vibrating portion; and an empty space that is disposed between the first doping region and the first vibrating portion, wherein the first and second doping regions are monolithic.

The first vibrating portion may include a plurality of through-holes, and a material film for sealing the plurality of through-holes may be formed on the first vibrating portion.

The first vibrating portion may include a vibrator disposed in the empty space, and parallel to the first doping region.

A second vibrating portion may be disposed in the empty space above the vibrator.

The second vibrating portion may include a plurality of through-holes.

A material film for sealing the plurality of through-holes may be formed on the first vibrating portion.

The first doping region may be doped with an n-type or a p-type material.

The material film may be one of a silicon oxide film, a silicon nitride film, and a polymer film.

According to an aspect of another embodiment, there is provided a method of manufacturing a transducer, the method including: providing a single-crystal silicon layer that includes a first doping region and a second doping region that are oppositely doped to each other; and forming an empty space in a limited area between the first and second doping regions.

The providing of the single-crystal silicon layer may include: providing a first single-crystal silicon layer doped with a first dopant; and forming the second doping region by doping a portion of the first single-crystal silicon layer with a second dopant.

The forming of the empty space may include: forming an oxidized region in the first doping region under the second doping region; and removing an oxidizing material of the formed oxidized region.

The removing of the oxidizing material of the oxidized region may include: forming through-holes through which the oxidized region is exposed in the second doping region on the oxidized region; and removing the oxidizing material through the through-holes.

The method may further include sealing the through-holes with a material film.

The providing of the single-crystal silicon layer may include: providing a first single-crystal silicon layer doped with a first dopant; forming an oxidized region under a top surface of the first single-crystal silicon layer; and growing a second single-crystal silicon layer doped with a second dopant on the first single-crystal silicon layer.

The method may further include extending a portion of the oxidized region toward the second single-crystal silicon layer.

The extending of the portion of the oxidized region toward the second single-crystal silicon layer may include: forming a first oxidized region that is connected to the oxidized region and extends into the second single-crystal silicon layer in a direction perpendicular to the oxidized region; and forming a second oxidized region that is connected to the first oxidized region and extends in a direction parallel to the oxidized region in the second single-crystal silicon layer.

The removing of the oxidizing material from the oxidized region of the first and second single-crystal silicon layers may further include: forming through-holes through which the oxidized region extending toward the second single-crystal silicon layer is exposed on the second single-crystal silicon layer; and removing the oxidizing material of the oxidized region of the first and second single-crystal silicon layers through the through-holes.

After the removing of the oxidizing material, the method may further include forming a material film for sealing the through-holes on the second single-crystal silicon layer.

The method may further include: growing a third single-crystal silicon layer on the second single-crystal silicon layer; extending the oxidized region into the third single-crystal silicon layer; and removing an oxidizing material of the oxidized region of the first through third single-crystal silicon layers.

The extending of the oxidized region into the third single-crystal silicon layer may include: forming a third oxidized region that is connected to a portion of the oxidized region extending into the second single-crystal silicon layer and passes through the second single-crystal silicon layer over the portion of the oxidized region extending into the second single-crystal silicon layer; and forming on the third single-crystal silicon layer a fourth oxidized region that is connected to the oxidized region passing through the second single-crystal silicon layer and is parallel to the second single-crystal silicon layer.

The removing of the oxidizing material of the oxidized region of the first through third single-crystal silicon layers may include: forming through-holes through which the fourth oxidized region is exposed on the third single-crystal silicon layer; and removing the oxidizing material of the oxidized region of the first through third single-crystal silicon layers through the through-holes.

The forming of the oxidized region may include: implanting oxygen ions into a corresponding portion where the oxidized region is to be formed; and thermally treating a resultant structure obtained after the oxygen ions are implanted.

The extending of the oxidized region into the third single-crystal silicon layer may include: implanting oxygen ions into a portion of the third single-crystal silicon layer into which the oxidized region is to extend; and thermally treating a resultant structure obtained after the oxygen ions are implanted.

The forming of the oxidized region may include: implanting oxygen ions into a corresponding portion where the oxidized region is to be formed; and thermally treating a resultant structure obtained after the oxygen ions are implanted.

According to an aspect of another embodiment, there is provided a method of operating a transducer, wherein the transducer includes a first doping region, a second doping region that is opposite in conductivity to the first doping region and includes a vibration portion, and an empty space, wherein the first and second doping regions are monolithic, the method including: applying a reverse bias between the first and second doping regions.

According to an aspect of another embodiment, there is provided a transducer including: a monolithic substrate including a first doping region, a second doping region that is opposite in conductivity to the first doping region, and a vibrating portion; and a first empty space within the substrate and below the vibrating portion.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
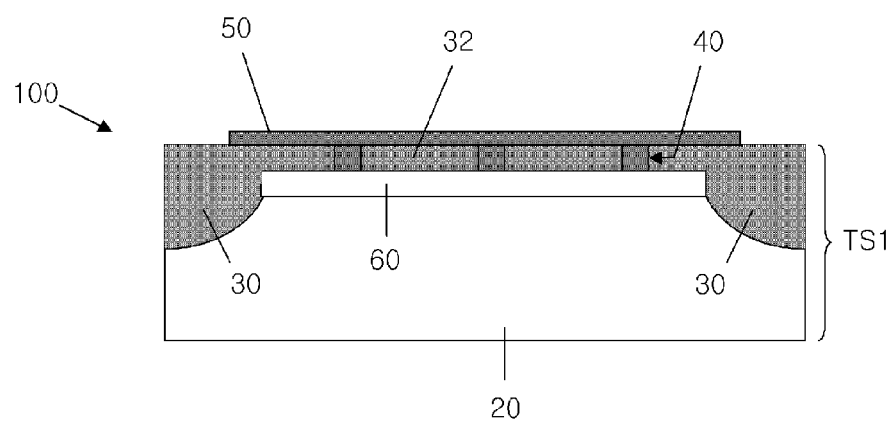
FIG. 1 is a cross-sectional view illustrating a capacitive transducer having a monolithic three-dimensional (3D) structure, according to an embodiment.

Exemplary embodiments will now be described more fully with reference to the accompanying drawings. In the drawings, thicknesses of layers or regions are exaggerated for clarity. The term "and/or" includes any and all combinations of one or more of the associated listed items.

FIG. 1 is a cross-sectional view illustrating a capacitive transducer (hereinafter, referred to as a transducer) 100 having a monolithic three-dimensional (3D) structure, according to an embodiment. A method of operating the transducer 100 will be explained when a structure of the transducer 100 and a method of manufacturing the transducer 100 are explained below.

Referring to FIG. 1, the transducer 100 includes a substrate TS1 which is a single-layered substrate. In exemplary embodiments described herein, the substrate TS1 is a silicon substrate. However, it is understood that one or more other embodiments are not limited thereto. For example, the substrate may be a Group III-V substrate or a SiC substrate. The silicon substrate TS1 may be a single-crystal silicon substrate. The silicon substrate TS1 includes a first doping region 20, second doping regions 30, and a third doping region 32. The second doping regions 30 and the third doping region 32 are disposed over the first doping region 20. The first doping region 20 is connected to the second doping regions 30.

Although the first through third doping regions 20, 30, and 32 are separated from one another in FIG. 1 and explanations are provided herein with an assumption that the first through third doping regions 20, 30, and 32 are separated from one another for purposes of clarity, boundary lines of the first through third doping regions 20, 30, and 32 may not actually be separated from one another according to one or more exemplary embodiments. The first doping region 20 is a region doped with a dopant opposite in conductivity to that of the second and third doping regions 30 and 32. The second and third doping regions 30 and 32 may include the same dopant. The first doping region 20 may include, for example, a p-type dopant. The second and third doping regions 30 and 32 may include, for example, an n-type dopant. The second doping regions 30 are deeper than the third doping region 32. The second doping regions 30 are spaced apart from each other to face each other with the third doping region 32 therebetween. The third doping region 32 disposed between the second doping regions 30 is connected to the second doping regions 30. Thus, the second and third doping regions 30 and 32 correspond to one doping region. Accordingly, the boundary between the second and third doping regions 30 and 32 may not be distinguishable. The third doping region 32 has a uniform thickness, though it is understood that one or more other embodiments are not limited thereto. For example, according to another exemplary embodiment, the third doping region 32 may have a non-uniform thickness. An empty space 60 is formed between the third doping region 32 and the first doping region 20. The empty space 60 may be a place where the third doping region 32 that is a vibrator (or a diaphragm) vibrates. Surfaces of the first doping region 20 and the third doping region 32 facing each other may be parallel to each other. Both sides of the third doping region 32 are connected to and supported by the second doping regions 30. Accordingly, the third doping region 32 may not warp downward when the third doping region 32 does not operate, and may be easily restored to its original state after the third doping region 32 operates. Hence, the third doping region 32 may serve as a desired anchor. The third doping region 32 may include a plurality of through-holes 40. A material film 50 for sealing the plurality of through-holes 40 is disposed on the third doping region 32. The through-holes 40 may be filled with the material film 50, partially or entirely. The material film 50 may be any one of a silicon oxide film, a silicon nitride film, and a polymer film. The polymer film may be formed of, for example, parylene. If the polymer film is formed of parylene, the polymer film may be deposited by using vapor phase deposition.

Meanwhile, the material film 50 for sealing the through-holes 40 may be omitted in one or more other exemplary embodiments. If the material film 50 is used, the empty space 60 may be maintained in vacuum, thereby increasing a Q-factor of the vibrator. However, even when the material 50 is not used, an operation of the transducer 100 may nonetheless be suitable.

Since the first doping region 20 and the second doping regions 30 are oppositely doped, the first and second doping regions 20 and 30 may form a PN junction. Accordingly, the first and second doping regions 20 and 30 form a PN junction diode. Hence, the first and second doping regions 20 and 30 used as electrodes of the transducer 100 may be electrically insulated from each other by applying an electrical signal such that when the transducer 100 operates, a reverse bias is applied between the first doping region 20 and the second doping regions 30. Thus, since the transducer 100 does not need an insulating layer between the first and second doping regions 20 and 30 which are used as electrodes, a problem caused by dielectric charging may be avoided.

Although the second doping regions 30 have quadrant circular shapes in FIG. 1, the second doping regions 30 may have other shapes in other exemplary embodiments. For example, the second doping regions 30 may have quadrangular shapes as shown in FIG. 2.

Figure 2:
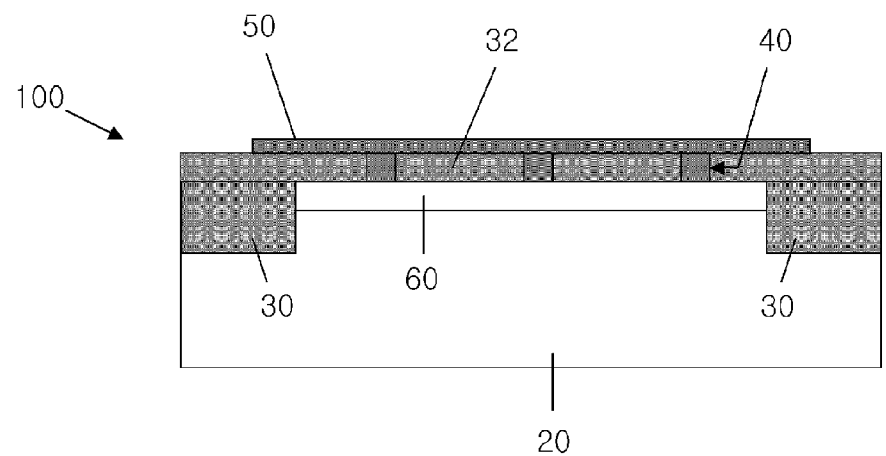
FIG. 2 is a cross-sectional view illustrating a modified example of a first doping region of the capacitive transducer of FIG. 1.

An oxidized region (not shown) may be disposed between the first and second doping regions 20 and 30 in FIGS. 1 and 2. The oxidized region may be formed by implanting oxygen ions between the first and second doping regions 20 and 30. If the oxidized region is formed, the first and second doping regions 20 and 30 may be naturally electrically insulated from each other due to the oxidized region.

Figure 3:
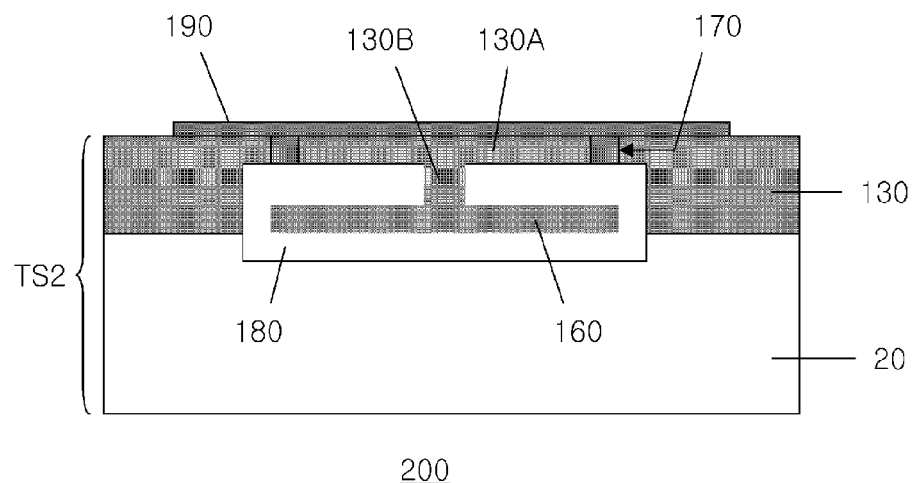
FIG. 3 is a cross-sectional view illustrating a transducer according to another embodiment.

FIG. 3 is a cross-sectional view illustrating a transducer 200 according to another exemplary embodiment. Referring to FIG. 3, the transducer 200 includes a silicon substrate TS2 which is a single-layered silicon substrate. The silicon substrate TS2 may be formed of the same material as that of the silicon substrate TS1 of FIG. 1. The silicon substrate TS2 includes the first doping region 20, fourth doping regions 130, and a fifth doping region 130A. The fourth and fifth doping regions 130 and 130A are disposed over the first doping region 20. A doping relationship between the first doping region 20 and the fourth and fifth doping regions 130 and 130A may be the same as that between the first doping region 20 and the second and third doping regions 30 and 32 of FIG. 1. The fourth and fifth doping regions 130 and 130A form a top surface of the silicon substrate TS2. The fourth and fifth doping regions 130 and 130A are integrally connected to each other. The fourth doping regions 130 are deeper than the fifth doping region 130A. An empty space 180 is formed between the fifth doping region 130A and the first doping region 20. The first doping region 20 and the fifth doping region 130A are spaced apart from each other due to the empty space 180. The empty space 180 partially extends toward the first doping region 20 and, thus, a surface of the first doping region 20 facing the fifth doping region 130A is concave. The first doping region 20 and the fourth doping regions 130 are connected to each other outside the empty space 180. A vibrator (or a diaphragm) 160 is disposed in the empty space 180. The vibrator 160 is connected to the fifth doping region 130A through a pillar 130B. Since the vibrator 160 and the pillar 130B are grown along with the fourth and fifth doping regions 130 and 130A by using epitaxial growth, the above elements are one continuous body without a border or a contact surface.

Accordingly, stability during operation may be higher than that when there is a border or a contact surface between the above elements. Since the fifth doping region 130A vibrates when the transducer 200 operates, the fifth doping region 130A and the vibrator 180 may correspond to a two-level anchor. The fifth doping region 130A, the vibrator 180, and a surface of the first doping region 20 facing the vibrator 180 (that is, a bottom surface of the empty space 180) may be parallel to one another. The fifth doping region 130A may include a plurality of through-holes 170. The plurality of through-holes 170 communicate with the empty space 180. A material film 190 for sealing the plurality of through-holes 170 is disposed on the fifth doping region 130A of the silicon substrate TS2. The material film 190 may extend over the fourth doping regions 130. The material film 190 may be filled in the plurality of through-holes 170, entirely or partially. Furthermore, it is understood that the material film 190 may be omitted in one or more other exemplary embodiments.

Figure 4:
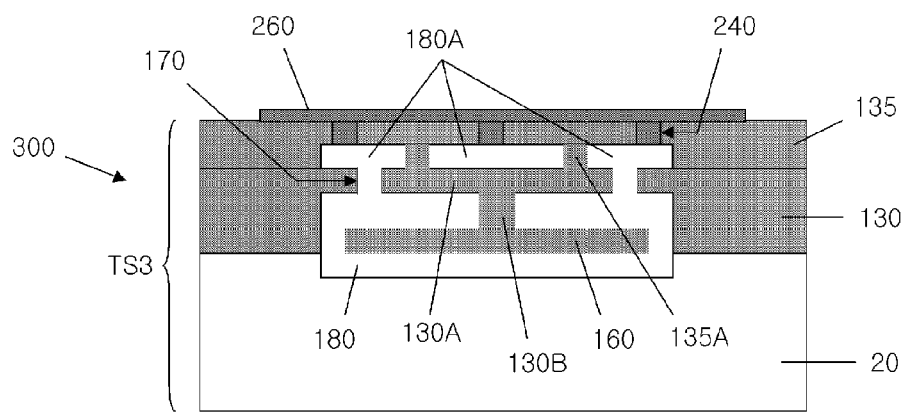
FIG. 4 is a cross-sectional view illustrating a transducer according to another embodiment.

FIG. 4 is a cross-sectional view illustrating a transducer 300 according to another exemplary embodiment. Referring to FIG. 4, the transducer 300 includes a silicon substrate TS3 which is a single-layered silicon substrate. The silicon substrate TS3 further includes a sixth doping region 135 formed on the fourth and fifth doping regions 130 and 130A (which are similar to the fourth and fifth doping regions 130 and 130A of the silicon substrate TS2 of FIG. 3). Since the sixth doping region 135 is grown by using epitaxial growth from the fourth and fifth doping regions 130 and 130A, there is no border or contact surface between the sixth doping region 135 and the fourth and fifth doping regions 130 and 130A. The sixth doping region 135 may include the same dopant as that of the fourth and fifth doping regions 130 and 130A. The sixth doping region 135 includes an empty space 180A. The empty space 180A is formed between the fifth doping region 130A and the sixth doping region 135. Pillars 135A which are spaced apart from each other are disposed in the empty space 180A. The pillars 135A connect the fifth doping region 130A and a portion of the sixth doping region 135 disposed over the empty space 180A. The portion of the sixth doping region 135 disposed over the empty space 180A is thinner than other portions of the sixth doping region 135. The portion of the sixth doping region 135 disposed over the empty space 180A is parallel to the fifth doping region 130A. The portion of the sixth doping region 135 disposed over the empty space 180A includes a plurality of through-holes 240. The plurality of through-holes 240 are connected to the empty space 180A. A material film 260 for sealing the plurality of through-holes 240 is disposed on the sixth doping region 135, that is, the silicon substrate TS3. The through-holes 240 may be filled with the material film 260, entirely or partially. Furthermore, it is understood that the material film 190 may be omitted in one or more other exemplary embodiments. When the transducer 300 operates, the vibrator 160, the fifth doping region 130A, and the portion of the sixth doping region 135 disposed over the empty space 180A may vibrate together. Accordingly, the transducer 300 may include a three-level anchor including the vibrator 160, the fifth doping region 130A, and the portion of the sixth doping region 135 disposed over the empty space 180A. The empty space 180A is connected to the empty space 180 formed under the empty space 180A through the through-holes 170 of the fifth doping region 130A. Accordingly, the empty spaces 180 and 180A form one empty space.

While the exemplary embodiments described above with reference to FIGS. 1 through 4 relate to transducers with a one-level anchor, a two-level anchor, and a three-level anchor, it is understood that one or more other exemplary embodiments are not limited thereto and may provide transducers with four or more-level anchors.

As described above, a diaphragm included in a transducer according to one or more exemplary embodiments is formed by removing a portion of a silicon substrate, and not by being joined or bonded to a silicon substrate. That is, the transducer is a monolithic transducer in which the diaphragm is a portion of the silicon substrate and there is no interface between the diaphragm and the silicon substrate due to bonding or deposition. The structural stability of the transducer may be higher than that of a related art transducer in which there is an interface due to bonding or deposition. Accordingly, the reliability of the transducer during operation may be improved.

Methods of manufacturing a transducer according to one or more exemplary embodiments will now be explained with reference to FIGS. 5 through 26. The same or similar elements as those in FIGS. 1 through 5 are denoted by the same reference numerals in FIGS. 5 through 26.

Figure 5:
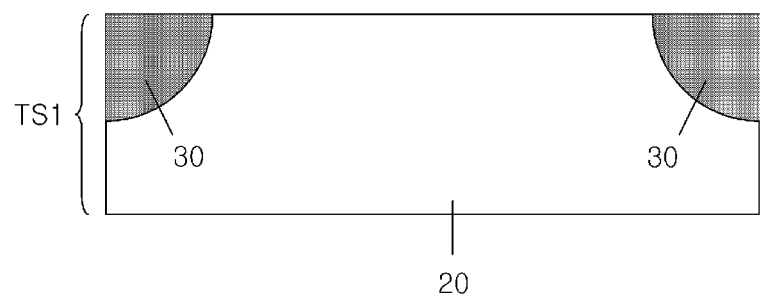
FIGS. 5 through 10 are cross-sectional views illustrating a method of manufacturing the transducer of FIG. 1.

FIGS. 5 through 10 are cross-sectional views illustrating a method of manufacturing the transducer 100 of FIG. 1 according to an exemplary embodiment. Referring to FIG. 5, the second doping regions 30 are formed on the silicon substrate TS1. The silicon substrate TS1 may be a single-crystal silicon substrate. The silicon substrate TS1 is doped with a material opposite in conductivity to a material with which the second doping regions 30 are doped. The silicon substrate TS1 may be, for example, a substrate doped with a p-type impurity. The second doping regions 30 may be, for example, regions doped with an n-type impurity. The second doping regions 30 may be formed on both ends of the silicon substrate TS1. The second doping regions 30 may be formed by using an oblique incidence doping method or masks having different thicknesses on the second doping regions 30. A region of the silicon substrate TS1 other than the second doping regions 30 in FIG. 5 is referred to as the first doping region 20 for convenience of description. Since the first and second doping regions 20 and 30 are doped with opposite dopants, the first and second doping regions 20 and 30 may form a PN junction diode. A reverse bias is applied between the first and second doping regions 20 and 30 when the transducer operates so that the first and second doping regions 20 and 30 are electrically insulated when the transducer 100 operates. The higher a breakdown voltage between the first and second doping regions 20 and 30, the better an efficiency. In order to increase a breakdown voltage, a doping concentration may be adjusted when the first and second doping regions 20 and 30 are formed. A breakdown voltage may be increased by inserting an insulating layer between the first and second doping regions 20 and 30. In this case, the insulating layer may be formed by implanting oxygen ions between the first and second doping regions 20 and 30.

Since a reverse bias is applied between the first and second doping regions 20 and 30, dielectric breakdown does not occur even when there is a mechanical contact when the transducer 100 operates.

Figure 6:
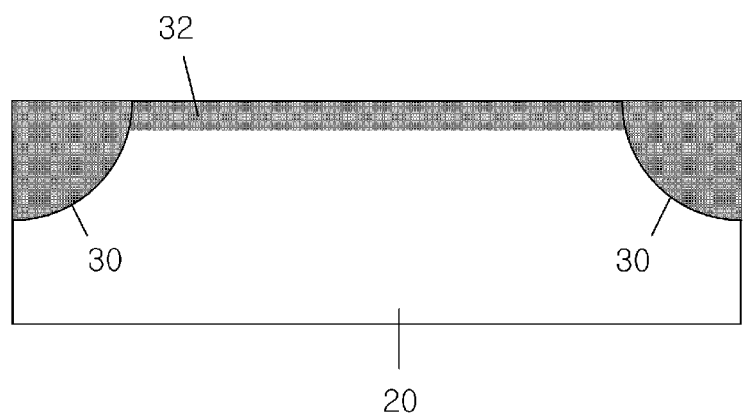

Referring to FIG. 6, the third doping region 32 is formed in an upper portion of the first doping region 20 between the second doping regions 30. The third doping region 32 may be formed by covering the second doping regions 30 with masks (not shown) and implanting a conductive impurity. The second doping regions 30 may also be formed in the same manner. The conductive impurity may be the same as a material with which the second doping regions 30 are doped. The third doping region 32 may be thinner than the second doping regions 30.

Figure 7:
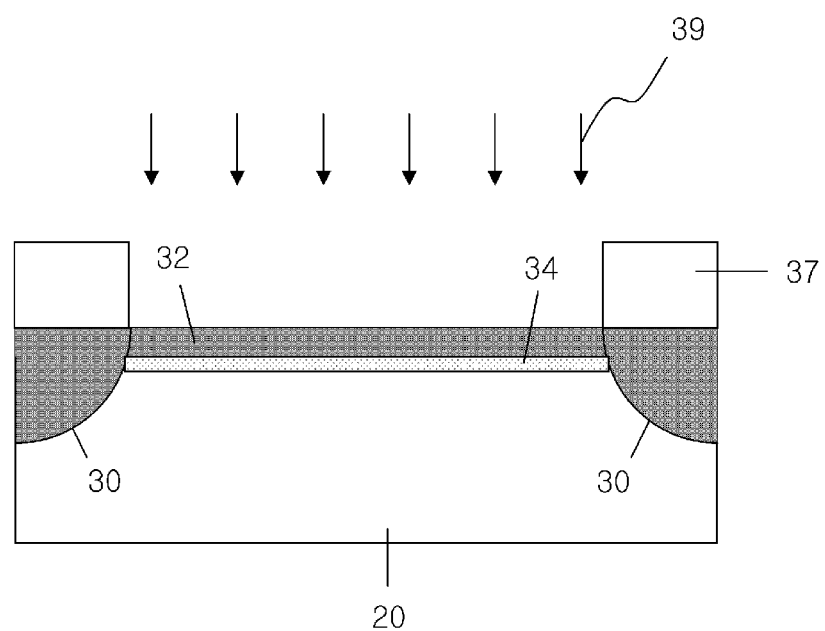

Referring to FIG. 7, a mask 37 is formed on the second doping regions 30. The mask 37 may be a photosensitive film pattern. When the mask 37 exists, oxygen ions are implanted into the silicon substrate TS1 through the third doping region 32 in an ion implantation process 39. After the ion implantation process 39, the mask 37 is removed. The oxygen ions may be forced to reach a portion under the third doping region 32 by adjusting ion implantation energy and the dose of oxygen in the ion implantation process 39. After the oxygen ions are implanted, the silicon substrate TS1 may be thermally treated by performing annealing or heating for a predetermined period of time. It is understood that in one or more other exemplary embodiments, the annealing or heating may be performed during the ion implantation process 39. Due to the ion implantation process 39 and the annealing, an oxidized region 34 having a predetermined thickness is formed under the third doping region 32. The oxidized region 34 is formed of silicon oxide. The oxidized region 34 is removed in a subsequent process and a region from which the oxidized region 34 is removed becomes a place where a vibrator vibrates. Accordingly, a thickness of the oxidized region 34 may be determined in consideration of a vibration range of the vibrator which is to be formed in a subsequent process. Accordingly, the dose of oxygen and ion implantation energy may be determined during the ion implantation process 39. During the ion implantation process 39, the dose of oxygen may range, for example, from about 1017 to about 1018/cm$^2$, and ion implantation energy may range, for example, from about 100 to about 200 KeV. It is understood, however, that one or more other exemplary embodiments are not limited thereto. For example, according to another exemplary embodiment, the dose of oxygen and ion implantation energy may exceed or be less than the above-described ranges.

Figure 8A:
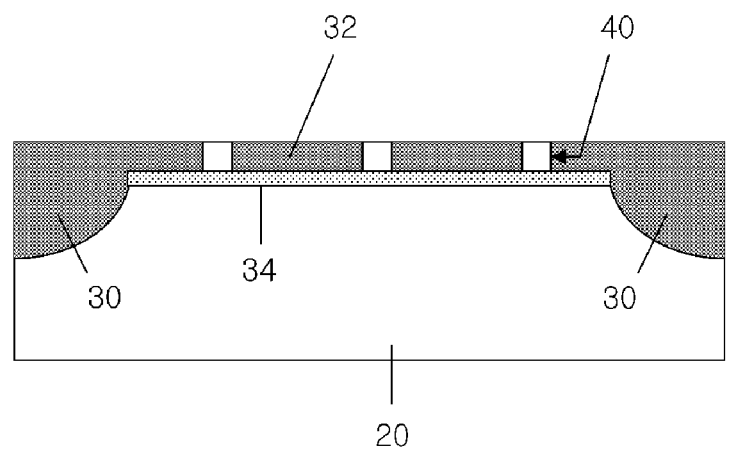
Figure 8B:
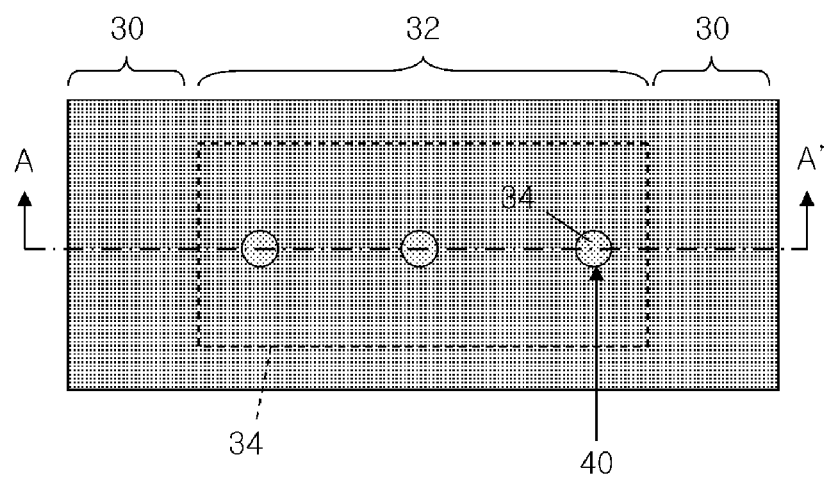
Figure 9:
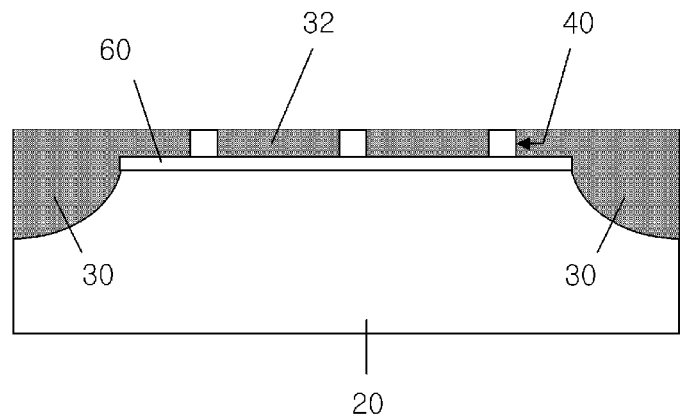

Referring to FIG. 8A, the plurality of through-holes 40 are formed in the third doping region 32. The oxidized region 34 is exposed through the plurality of through-holes 40. FIG. 8B is a plan view of FIG. 8A. FIG. 8A is a cross-sectional view taken along line A-A' of FIG. 8B. Referring to FIG. 8B, the oxidized region 34 has a quadrangular shape. Although three through-holes 40 are shown in FIG. 8B, the number of the plurality of through-holes 40 may be greater than or less than three in one or more other exemplary embodiments. Also, diameters of the plurality of through-holes 40 may differ from one another in one or more other exemplary embodiments. In FIGS. 8A and 8B, silicon oxide of the oxidized region 34 is removed through the through-holes 40. In this case, the silicon oxide may be removed by using a wet etchant, for example, hydrofluoric acid (HF). The silicon oxide of the oxidized region 34 may be removed through the through-holes 40 by dipping a resultant structure of FIGS. 8A and 8B in a container in which the wet etchant is stored. In this case, since a selectivity of the wet etchant with respect to the silicon oxide is very high, other portions are not etched while the silicon oxide is removed. When the silicon oxide is removed from the oxidized region 34 due to the wet etching, the empty space 60 is formed under the third doping region 32 as shown in FIG. 9.

As the empty space 60 is formed, the third doping region 32 has a plate shape. The third doping region 32 serves as an anchor, and becomes a vibrator (or a diaphragm) that vibrates according to a signal applied to the vibrator when the transducer 100 operates.

Figure 10:
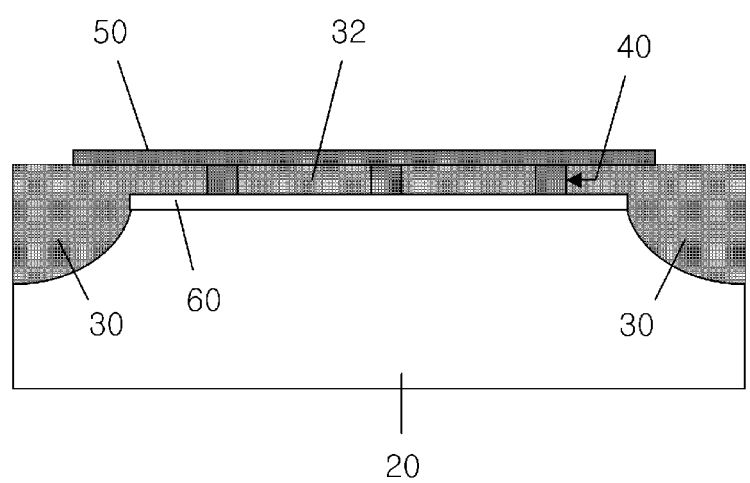

Referring to FIG. 10, the material film 50 for sealing the through-holes 40 is formed on the third doping region 32. The material film 50 may be formed by using zero-level vacuum packaging. The through-holes 40 may be filled with the material film 50. The material film 50 may be optionally formed, and may partially or entirely fill the through-holes 40.

In this manner, the transducer 100 is manufactured.

FIGS. 11 through 18 are cross-sectional views illustrating a method of manufacturing the transducer 200 of FIG. 3 according to an exemplary embodiment.

Figure 11:
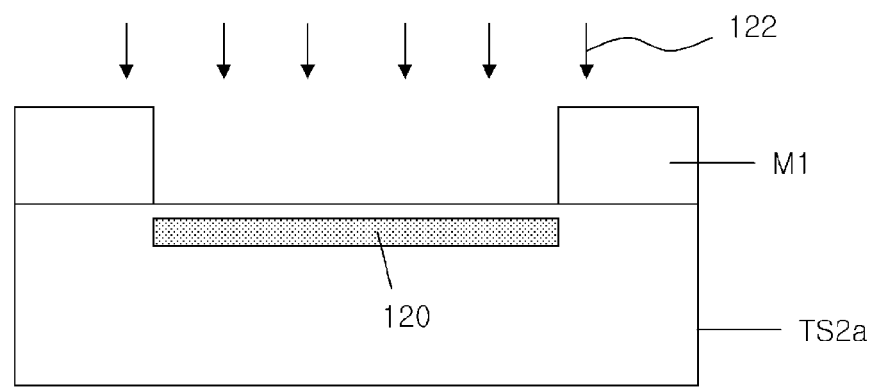
FIGS. 11 through 18 are cross-sectional views illustrating a method of manufacturing the transducer of FIG. 3.

Referring to FIG. 11, a mask M1 through which a portion of a top surface of a first silicon layer TS2a is exposed is formed on the first silicon layer TS2a. The first silicon layer TS2a may be a single-crystal silicon layer, and may be a substrate doped with a p-type or an n-type impurity. When the mask M1 exists, oxygen ions are implanted in an ion implantation process 122 into the exposed portion of the first silicon layer TS2a. During or after the ion implantation process 122, the first silicon layer TS2a may be annealed or heated. Next, the mask M1 is removed. In this manner, an oxidized region 120 is formed under a top surface of the exposed portion of the first silicon layer TS2a. The oxidized region 120 may be formed of silicon oxide. A position and a thickness of the oxidized region 120 may be determined by at least one of the dose of oxygen and the ion implantation energy during the ion implantation process 122. The dose of oxygen and the ion implantation energy during the ion implantation process 122 may be determined in the ranges used when the oxidized region 34 of FIG. 7 is formed.

Figure 12:
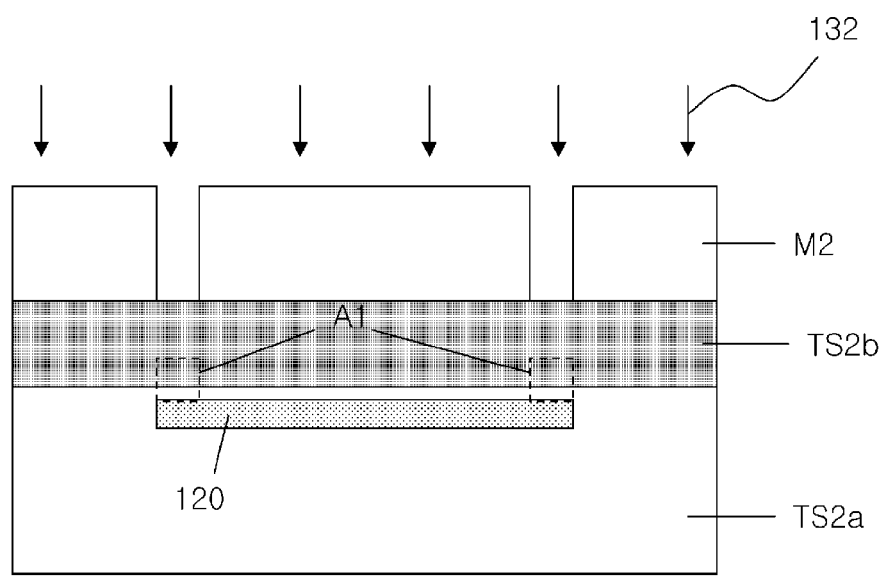

Referring to FIG. 12, a second silicon layer TS2b is formed to a predetermined thickness on the first silicon layer TS2a. The second silicon layer TS2b which is a single-crystal silicon layer may be a substrate oppositely doped to the first silicon layer TS2a. The second silicon layer TS2b may be a substrate doped with a p-type or an n-type impurity. After the oxidized region 120 is formed, the second silicon layer TS2b may be formed in situ. The second silicon layer TS2b may be formed by using epitaxial growth, and may be doped during the epitaxial growth. Accordingly, there is no interface or a contact surface between the first and second silicon layers TS2a and TS2b. A source gas used when the second silicon layer TS2b is formed may be a compound including silicon (Si) and hydrogen (H), a compound including Si and chlorine (Cl), or a compound including Si, H, and Cl.

After the second silicon layer TS2b is formed, a mask M2 through which portions of the second silicon layer TS2b are exposed is formed on the second silicon layer TS2b. The mask M2 may be a photosensitive film pattern. The mask M2 may be formed such that portions of a top surface of the second silicon layer TS2b corresponding to both edge portions of the oxidized region 120 are exposed. Oxygen ions are implanted in an ion implantation process 132 into the exposed portions of the second silicon layer TS2b. During the ion implantation process 132, the oxygen ions are forced to reach portions A1 marked by dotted lines over both edges of the oxidized region 120 by adjusting the dose of oxygen and ion implantation energy. In order to uniformly diffuse the oxygen ions through the portions A1 during the ion implantation process 132, the first and second silicon layers TS2a and TS2b may be annealed or heated. The annealing or heating may be performed during or after the ion implantation process 132. Due to the ion implantation process 132 and the heating, oxidized regions 140 are formed over both edges of the oxidized region 120 as shown in FIGS. 13A and 13B.

Figure 13A:
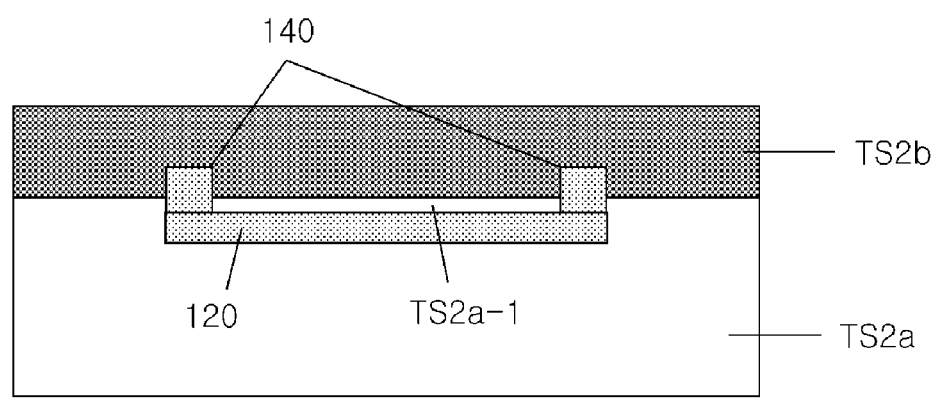

Referring to FIG. 13A, each of the oxidized regions 140 includes a portion of the first silicon layer TS2a between the oxidized region 120 and the second silicon layer TS2b, and a portion of the second silicon layer TS2b disposed over the portion of the first silicon layer TS2a. The oxidized regions 140 include silicon oxide. The oxidized regions 140 are formed in a direction perpendicular to the oxidized region 120, to partially pass through the first silicon layer TS2a and the second silicon layer TS2b. Due to the oxidized regions 120 and 140, a portion TS2a-1 of the first silicon layer TS2a is isolated between the oxidized region 120 and the second silicon layer TS2b. FIG. 13B is a top plan view of FIG. 13A. FIG. 13A is a cross-sectional view taken along line A-A' of FIG. 13B.

Figure 13B:
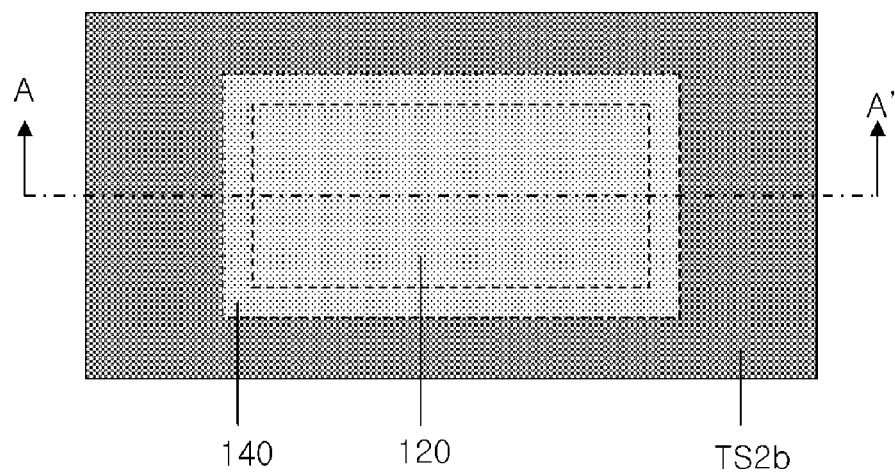

Referring to FIG. 13B, the oxidized region 120 has a quadrangular shape, and the oxidized regions 140 are formed along edges of the oxidized region 120.

Figure 14:
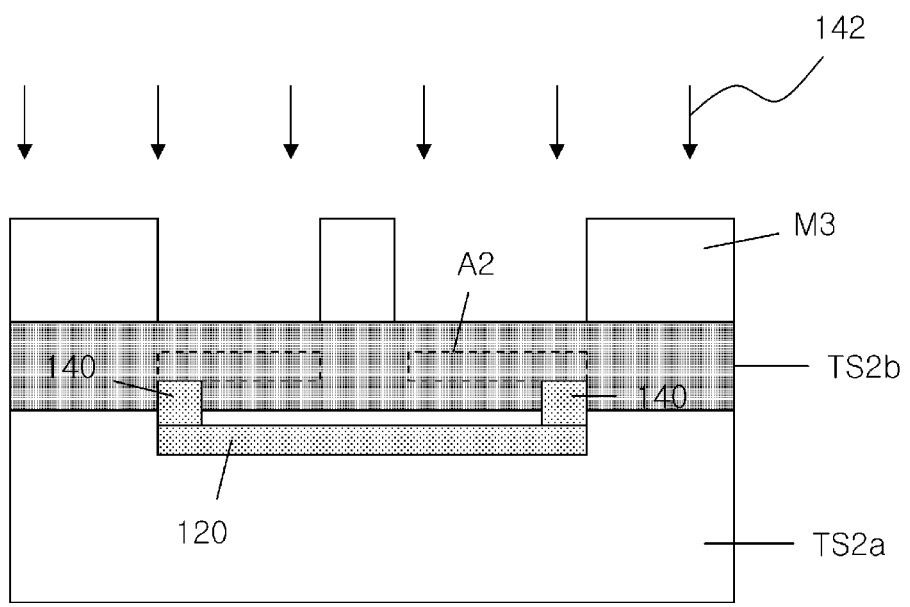

Referring to FIG. 14, a mask M3 through which portions of a top surface of the second silicon layer TS2b are exposed are formed on the second silicon layer TS2b. The mask M3 may be formed such that the portions of the top surface of the second silicon layer TS2b corresponding to portions A2 marked by dotted lines over the oxidized regions 140 are exposed. When the mask M3 exists, oxygen ions are implanted in an ion implantation process 142 into the exposed portions of the second silicon layer TS2b. After the ion implantation process 142, the mask M4 may be removed. Although the ion implantation process 142 may be performed in the same manner as the aforementioned ion implantation processes 39, 122, and 132, the dose of oxygen and/or ion implantation energy may be different. Due to the ion implantation process 142, oxidized regions 150 are formed in the portions A2 as shown in FIG. 15.

Figure 15:
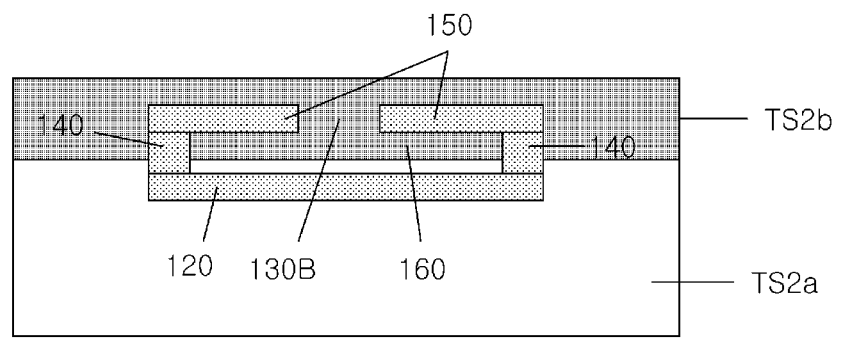

Referring to FIG. 15, one ends of the oxidized regions 150 are connected to the oxidized regions 140, and the other ends of the oxidized regions 150 face each other very closely. Since the oxidized regions 120, 140, and 150 are connected to one another, the oxidized regions 120, 140, and 150 may be one oxidized region. The oxidized regions 150 and the oxidized region 120 may be connected to each other through the oxidized regions 140 and may be parallel to each other. A portion of the second silicon layer TS2b between the oxidized regions 150 and the oxidized region 120 becomes the vibrator (or the diaphragm) 160 that vibrates when the transducer 200 operates. A portion of the second silicon layer TS2b disposed between the oxidized regions 150 becomes the pillar 130B that connects the vibrator 160 to a portion of the second silicon layer TS2b disposed over the oxidized regions 150.

Figure 16:
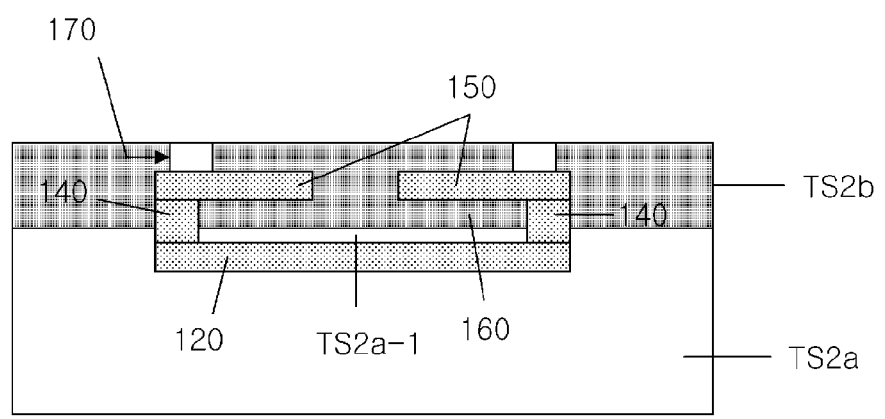

Referring to FIG. 16, the plurality of through-holes 170 may be formed in the portion of the second silicon layer TS2b disposed over the oxidized regions 150. The oxidized regions 150 are exposed through the through-holes 170. The through-holes 170 may be formed over the oxidized regions 140. Silicon oxide remaining in the oxidized regions 120, 140, and 160 is removed through the through-holes 170. The silicon oxide remaining in the oxidization regions 120, 140, and 160 may be removed in the same manner as that used when the silicon oxide remaining in the oxidized region 34 of FIG. 8 is removed. As the silicon oxide is removed from the oxidized regions 120, 140, and 160, the oxidized regions 120, 140, and 160 become the empty space 180 as shown in FIG. 17.

Figure 17:
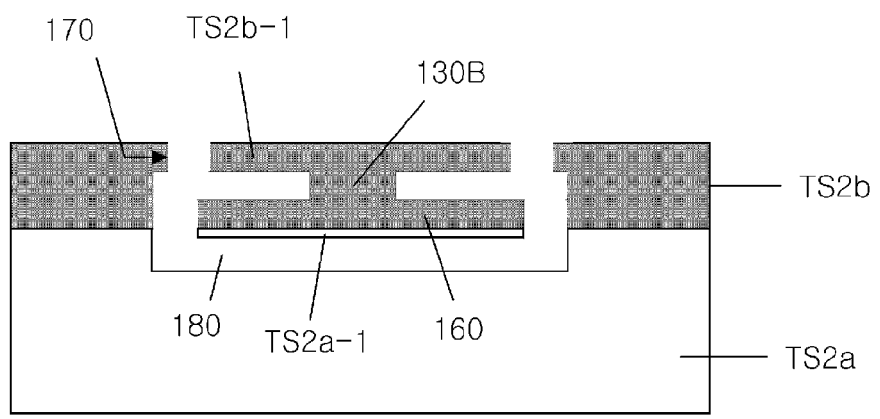

Referring to FIG. 17, the vibrator (or the diaphragm) 160 is formed in the empty space 180, and the vibrator 160 is connected to the second silicon layer TS2b through the pillar 130B. A bottom surface of the vibrator 160 is covered by the portion TS2a-1 of the first silicon layer TS2a. When the transducer 200 operates, the vibrator 160 and a thin portion TS2b-1 of the second silicon layer TS2b to which the vibrator 160 is connected may vibrate together.

Figure 18:
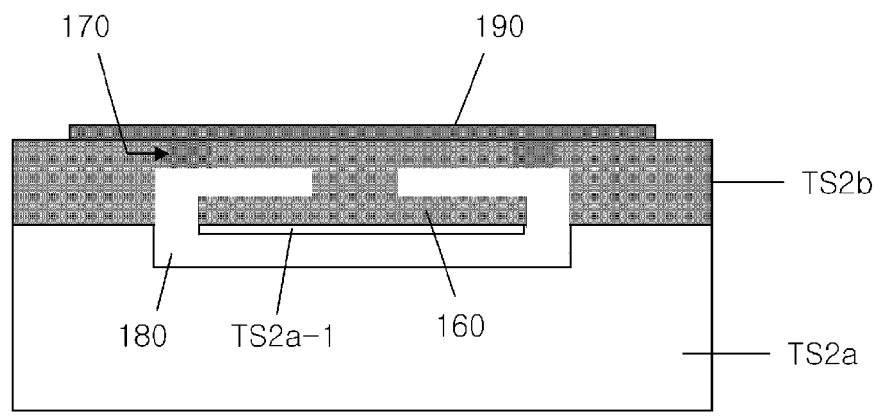

Referring to FIG. 18, the material film 190 for sealing the through-holes 170 is formed on the second silicon layer TS2b. The material film 190 may be formed in the same manner as that of the material film 50 of FIG. 10. When the material film 190 is formed, the through-holes 170 may be entirely or partially filled with the material film 190. In this manner, the transducer 200 is manufactured.

FIGS. 19 through 26 are cross-sectional views illustrating a method of manufacturing the transducer 300 of FIG. 4 according to an exemplary embodiment.

Figure 19:
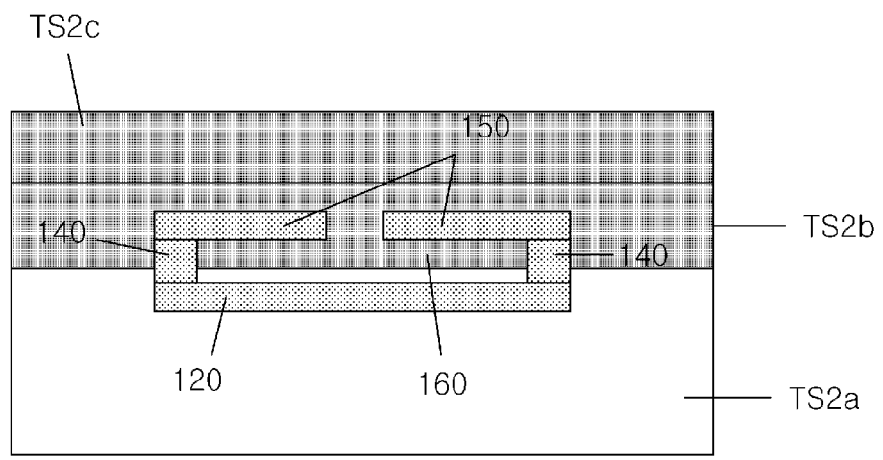
FIGS. 19 through 26 are cross-sectional views illustrating a method of manufacturing the transducer of FIG. 4.

Referring to FIG. 19, a resultant structure of FIG. 15 is formed by using the method of FIGS. 11 through 14. Next, a third silicon layer TS2c is formed on the second silicon layer TS2b. The third silicon layer TS2c may include the same dopant as the second silicon layer TS2b. The third silicon layer TS2c may be formed in situ. The third silicon layer TS2c may be formed in the same manner as that used to form the second silicon layer TS2b. The third silicon layer TS2c may be doped while being formed.

Figure 20:
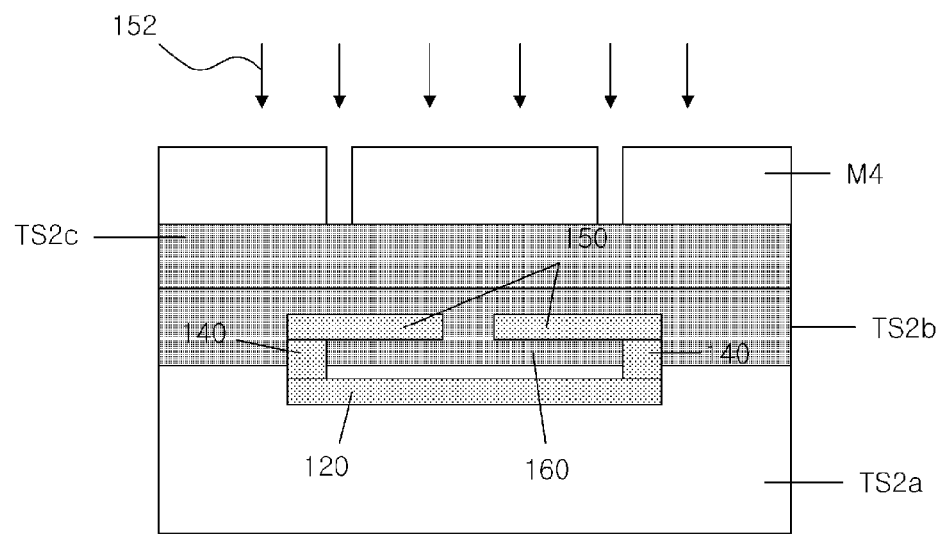
Figure 21:
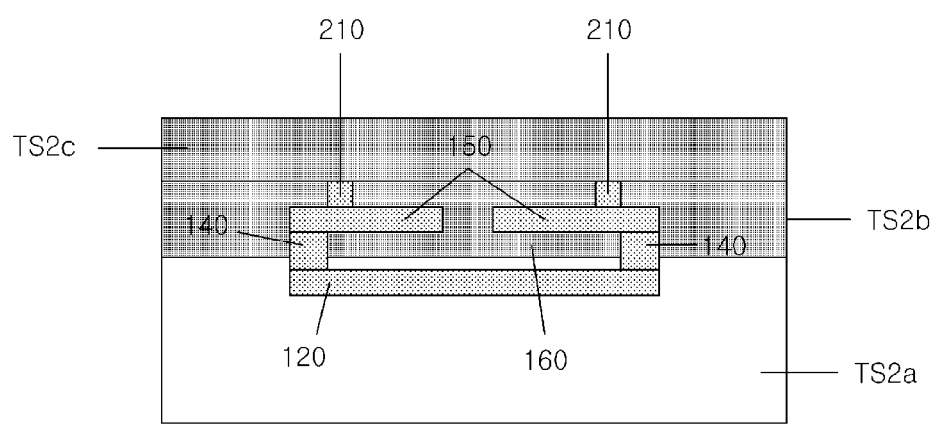

Referring to FIG. 20, a mask M4 through which portions of a top surface of the third silicon layer TS2c are exposed is formed on the third silicon layer TS2c. The mask M4 is used to implant oxygen ions into portions of the second silicon layer TS2b over the oxidized regions 150. The mask M4 may be formed such that the portions of the third silicon layer TS2c corresponding to the portions of the oxidized regions 150 are exposed. When the mask M4 exists, oxygen ions are implanted in an ion implantation process 152 into the exposed portions of the third silicon layer TS2c. The dose of oxygen and ion implantation energy during the ion implantation process 152 may be adjusted in consideration of positions and thicknesses of oxidized regions 210 formed by the ion implantation process 152. After the ion implantation process 152, the mask M4 is removed. Due to the ion implantation process 152, the oxidized regions 210 are formed on the second silicon layer TS2b between the oxidized regions 150 and the third silicon layer TS2c as shown in FIG. 21. The oxidized regions 210 are formed on the oxidized regions 150, and are spaced apart from each other.

Referring to FIG. 21, the oxidized regions 210 are connected to the oxidized regions 150. Accordingly, the oxidized regions 120, 140, 150, and 210 become one oxidized region. The oxidized regions 210 may extend from the oxidized regions 150 to the third silicon layer TS2c.

Figure 22A:
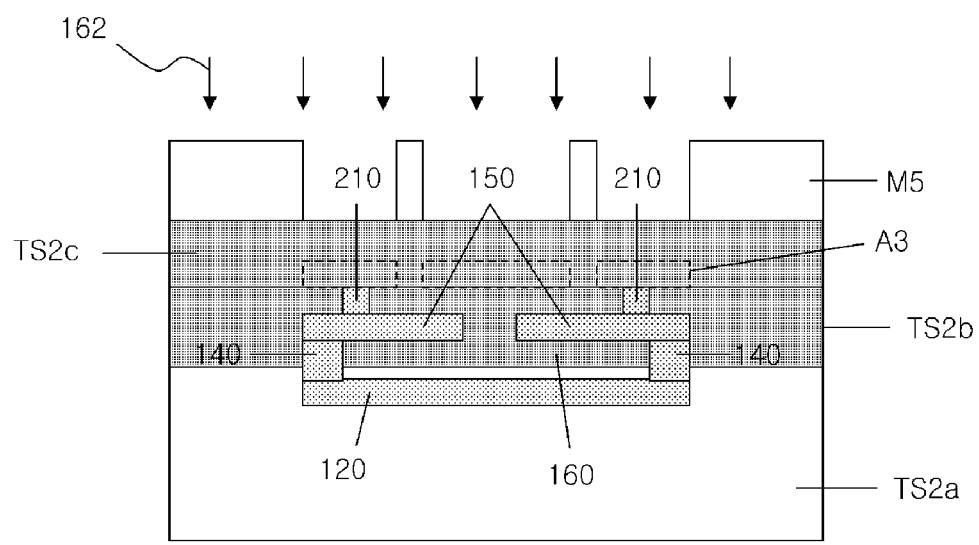
Figure 22B:
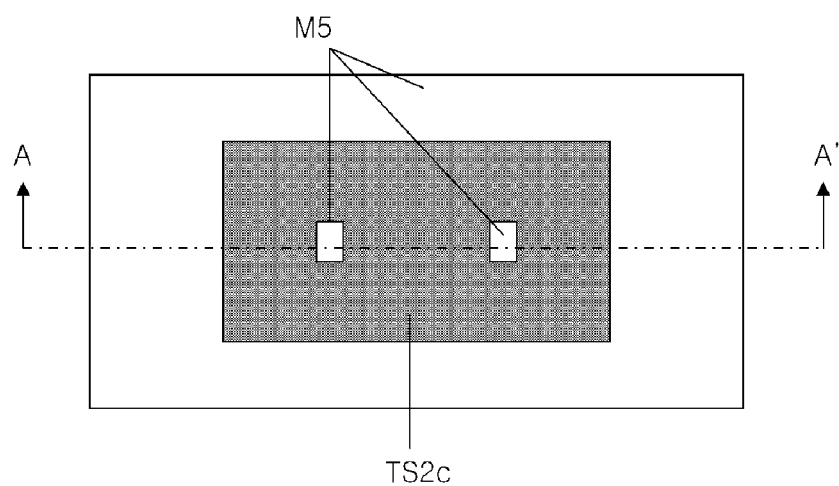

Referring to FIGS. 22A and 22B, a mask M5 through which portions of the top surface of the third silicon layer TS2c are exposed is formed or provided on the third silicon layer TS2c. The mask M5 is used to implant oxygen ions in an ion implantation process 162 into portions A3 marked by dotted lines over the oxidized regions 210 in the third silicon layer TS2c. When the mask M5 exists, oxygen ions are implanted in the ion implantation process 162 into the exposed portions of the top surface of the third silicon layer TS2c. Next, the mask M5 is removed. FIG. 22B is a top plan view of FIG. 22A. FIG. 22A is a cross-sectional view taken along line A-A' of FIG. 22B. Referring to FIG. 22B, the portions A3 where oxygen ions of the third silicon layer TS2c are to be implanted are defined to be quadrangular shapes. Portions of the mask M5 disposed between the portions A3 of the third silicon layer TS2c define the pillars 135A disposed between oxidized regions 220 of FIG. 23. During or after the ion implantation process 162 of FIG. 22A, annealing or heating may be performed. Accordingly, the oxidized regions 220 are formed in the third silicon layer TS2c as shown in FIG. 23.

Figure 23:
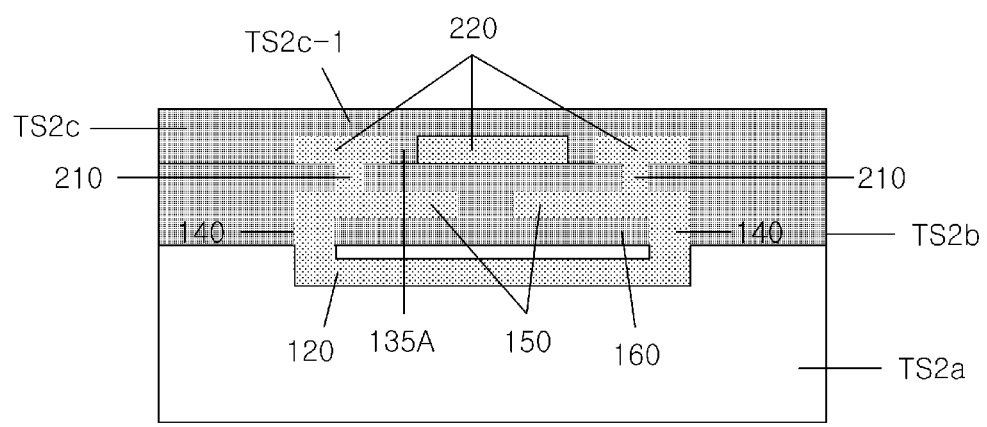

Referring to FIG. 23, the oxidized regions 220 may be parallel to the oxidized regions 150. The pillars 135A are disposed between the oxidized regions 220. The pillars 135A connect a portion TS2c-1 of the third silicon layer TS2c disposed over the oxidized regions 220 and a portion of the second silicon layer TS2b between the oxidized regions 210. The oxidized regions 220 are connected to the oxidized regions 210 disposed under the oxidized regions 220. Accordingly, the oxidized regions 220 may become one oxidized region with the oxidized regions 120, 140, 150, and 210 disposed under the oxidized regions 220. As the oxidized regions 220 are formed in the third silicon layer TS2c, the portion TS2c-1 of the third silicon layer TS2c disposed over the oxidized regions 220 has a thinner plate shape than portions outside the oxidized regions 220.

Figure 24A:
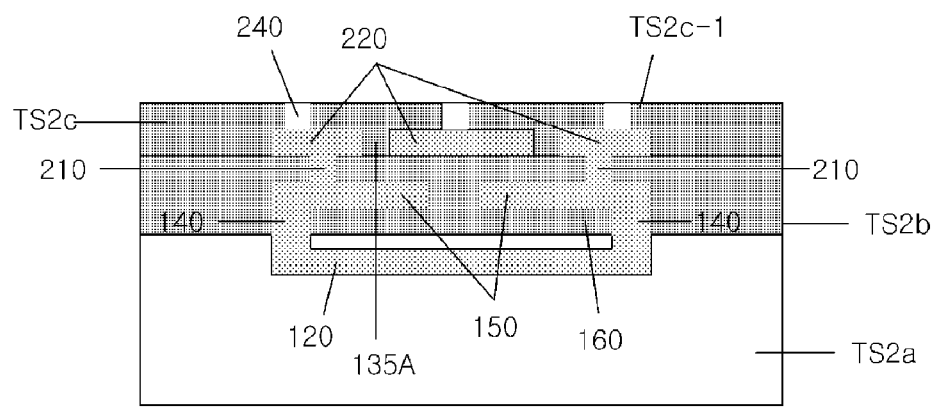
Figure 24B:
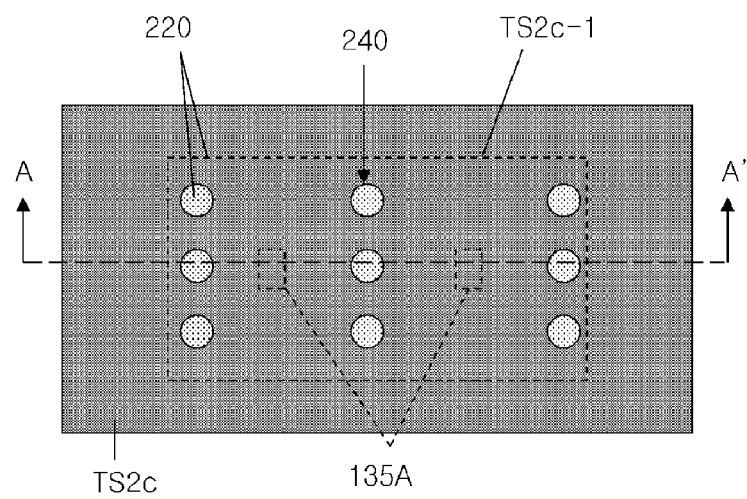

Referring to FIGS. 24A and 24B, the plurality of through-holes 240 are formed in the portion TS2c-1 of the third silicon layer TS2c disposed over the oxidized regions 220. FIG. 24B is a top plan view of FIG. 24A. FIG. 24A is a cross-sectional view taken along line A-A' of FIG. 24B. Referring to FIG. 24B, the oxidized regions 220 are exposed through the through-holes 240. The through-holes 240 are longitudinally formed in the portion TS2c-1 of the third silicon layer TS2c disposed over the oxidized region 220 to be spaced apart from one another.

After the through-holes 240 are formed, silicon oxide remaining in the oxidized regions 120, 140, 150, 210, and 220 is removed through the through-holes 240. The silicon oxide may be removed in the same manner as that used when the silicon oxide remaining in the oxidized region 34 of FIG. 8 is removed. As the silicon oxide is removed from the oxidized regions 120, 140, 150, 210, and 220, an empty space 250 is formed in the oxidized regions 120, 140, 150, 210, and 220 as shown in FIG. 25.

Figure 25:
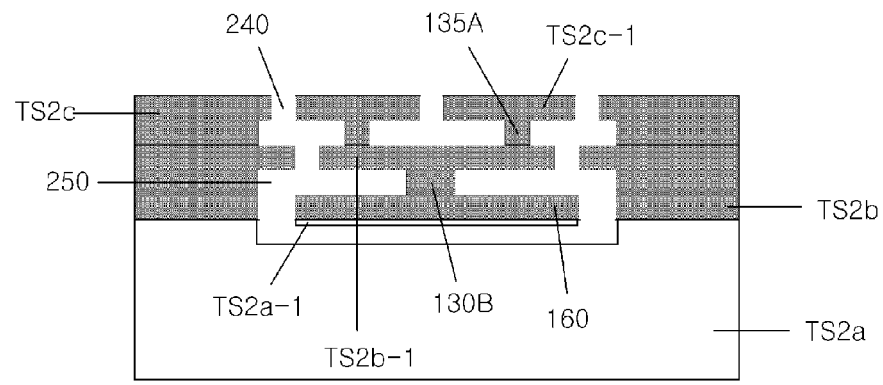

Referring to FIG. 25, the vibrator (or the diaphragm) 160 having a bottom surface covered by the portion TS2c-1 of the first silicon layer TS2a is disposed in the empty space 250. The vibrator 160 is connected to the thin portion TS2b-1 of the second silicon layer TS2b through the pillar 130B, and the thin portion TS2b-1 of the second silicon layer TS2b is connected to the thin portion TS2c-1 of the third silicon layer TS2c through the pillars 135A. Accordingly, when the transducer 300 operates, the vibrator 160, the thin portion TS2b-1 of the second silicon layer TS2b, and the thin portion TS2c-1 of the third silicon layer TS2c may vibrate together.

Figure 26:
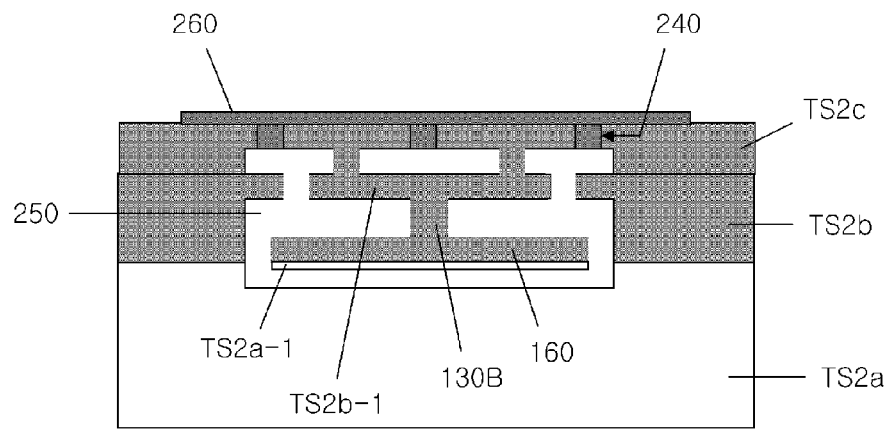

Referring to FIG. 26, the material film 260 for sealing the through-holes 240 is formed on a top surface of the third silicon layer TS2c. The material film 260 may be formed in the same manner as that used to form the material film 190 of FIG. 18. In this manner, the transducer 300 having a three-level anchor is manufactured. The material film 260 is optionally formed. Accordingly, sealing of the through-holes 240 may be omitted.

While the above-described exemplary embodiments suggest a particular order for doping, it is understood that one or more other exemplary embodiments are not limited thereto, and any doping order may be used. For example, the third doping region 32 may be doped prior to, or at the same time as, the second doping region 30.

As described above, a method of manufacturing a transducer includes processes such as doping, silicon layer growth, ion implantation (oxidization), and removal of silicon oxide, and a transducer is manufactured by repeatedly performing the processes. Since the processes are processes used in a complementary metal oxide semiconductor (CMOS) process, the method according to an exemplary embodiment may use the CMOS process. Accordingly, a process may be simplified, additional costs may not be incurred, and production costs may be reduced.

Also, a transducer according to an exemplary embodiment may be used as another device, for example, a resonator, a varactor, a mechanical switch, or a modulator.

While exemplary embodiments have been particularly shown and described above, it will be understood by those of ordinary skill in the art that various changes in form and details may be made therein without departing from the spirit and scope of the present inventive concept as defined by the following claims.

What is claimed is:

1. A transducer comprising:
a monolithic substrate comprising:
a first doping region;
a second doping region that is opposite in conductivity to the first doping region, the second doping region comprising a first vibrating portion; and
a first empty space between the first doping region and the first vibrating portion.

2. The transducer of claim 1, wherein the first vibrating portion comprises a plurality of first through-holes.

3. The transducer of claim 2, wherein the first vibrating portion further comprises a first material film which seals the plurality of first through-holes.

4. The transducer of claim 1, wherein the first vibrating portion comprises a first vibrator disposed above the first empty space, and parallel to a top of the first doping region.

5. The transducer of claim 4, wherein the monolithic substrate further comprises a second empty space above the first empty space,
wherein the second doping region further comprises a second vibrating portion disposed above the first vibrating portion, and
wherein the second empty space is between the first vibrating portion and the second vibrating portion.

6. The transducer of claim 5, wherein the second vibrating portion comprises a plurality of second through-holes.

7. The transducer of claim 6, wherein the second vibrating portion further comprises a second material film which seals the plurality of second through-holes.

8. The transducer of claim 1, wherein the first doping region is doped with an n-type material or a p-type material.

9. The transducer of claim 3, wherein the material film comprises at least one of a silicon oxide film, a silicon nitride film, and a polymer film.

10. The transducer of claim 5, wherein the monolithic substrate further comprises a third empty space above the second empty space,
wherein the second vibrating portion comprises a second vibrator disposed above the second empty space, and parallel to a top of the first doping region,
wherein the second doping region further comprises a third vibrating portion disposed above the second vibrating portion, and
wherein the third empty space is between the second vibrating portion and the third vibrating portion.

11. The transducer of claim 5, wherein the second empty space comprises a fourth empty space and a fifth empty space separated by a pillar.

12. The transducer of claim 1, wherein the first doping region and the second doping region form a PN junction.

13. The transducer of claim 1, wherein the monolithic substrate further comprises an oxidized region between the first doping region and the second doping region.

14. The transducer of claim 1, wherein the monolithic substrate is a single-crystal silicon substrate.

15. A transducer comprising:
a monolithic substrate comprising:
a first doping region;
a second doping region that is opposite in conductivity to the first doping region, and a vibrating portion; and
a first empty space within the substrate and adjacent to the vibrating portion.

* * * * *